(12) United States Patent
Gidon et al.

(10) Patent No.: US 7,453,789 B2
(45) Date of Patent: Nov. 18, 2008

(54) DATA RECORDING DEVICE WITH CONDUCTING MICROTIPS AND PRODUCTION METHOD THEREOF

(75) Inventors: Serge Gidon, La Murette (FR); Yves Samson, Saint Martin d'Heres (FR)

(73) Assignee: Commissariat a l'Energie Atomique, Paris (FR)

( * ) Notice: Subject to any disclaimer, the term of this patent is extended or adjusted under 35 U.S.C. 154(b) by 458 days.

(21) Appl. No.: 10/576,096

(22) PCT Filed: Oct. 26, 2004

(86) PCT No.: PCT/FR2004/002755

§ 371 (c)(1), (2), (4) Date: Apr. 18, 2006

(87) PCT Pub. No.: WO2005/048255

PCT Pub. Date: May 26, 2005

(65) Prior Publication Data
US 2007/0121476 A1    May 31, 2007

(30) Foreign Application Priority Data
Nov. 6, 2003    (FR) ................................ 03 13042

(51) Int. Cl.
*G11B 9/00* (2006.01)

(52) U.S. Cl. ...................................... 369/126; 369/135

(58) Field of Classification Search ........................ None
See application file for complete search history.

(56) References Cited

U.S. PATENT DOCUMENTS

| 5,751,683 | A | 5/1998 | Kley |
| 5,756,997 | A | 5/1998 | Kley |
| 6,144,028 | A | 11/2000 | Kley |
| 6,146,227 | A | 11/2000 | Mancevski |
| 6,229,138 | B1 | 5/2001 | Kley |
| 6,232,597 | B1 | 5/2001 | Kley |
| 6,242,734 | B1 | 6/2001 | Kley |
| 6,252,226 | B1 | 6/2001 | Kley |
| 6,265,711 | B1 | 7/2001 | Kley |
| 6,281,491 | B1 | 8/2001 | Kley |

(Continued)

FOREIGN PATENT DOCUMENTS

EP    1 054 249 A1    11/2000

(Continued)

*Primary Examiner*—Paul Huber
(74) *Attorney, Agent, or Firm*—Oliff & Berridge, PLC

(57) ABSTRACT

The invention relates to a data-recording device comprising conductive microtips and to the production method thereof. According to the invention, the microtip comprises one end which is intended to be brought into electrical contact with a recording medium. Moreover, the microtip comprises a longitudinal conducting core having an essentially constant cross-section. In addition, the microtip is surrounded by a sheath of non-conducting material, such that the free ends of the core and the sheath are level at the end of the microtip. The cross-section of the sheath can diminish towards the end of the microtip, e.g. such as to form a truncated-cone-shaped part. The core can comprise a carbon nanotube. Furthermore, a multitude of microtips can be disposed in the form of a network, the ends thereof generating an essentially-flat common surface. The inventive method comprises an abrasion step.

14 Claims, 5 Drawing Sheets

U.S. PATENT DOCUMENTS

| | | |
|---|---|---|
| 6,337,479 B1 | 1/2002 | Kley |
| 6,353,219 B1 | 3/2002 | Kley |
| 6,369,379 B1 | 4/2002 | Kley |
| 6,396,054 B1 | 5/2002 | Kley |
| 6,515,277 B1 | 2/2003 | Kley |
| 6,528,785 B1 | 3/2003 | Nakayama et al. |
| 6,597,090 B1 | 7/2003 | Mancevski |
| 7,020,064 B2 * | 3/2006 | Kim et al. .................... 369/126 |
| 7,042,828 B2 * | 5/2006 | Kley .......................... 369/126 |
| 2001/0010668 A1 | 8/2001 | Kley |
| 2002/0003211 A1 | 1/2002 | Kley |
| 2002/0084410 A1 | 7/2002 | Colbert et al. |
| 2002/0088938 A1 | 7/2002 | Colbert et al. |
| 2002/0092983 A1 | 7/2002 | Colbert et al. |
| 2002/0092984 A1 | 7/2002 | Colbert et al. |
| 2002/0096634 A1 | 7/2002 | Colbert et al. |
| 2002/0102201 A1 | 8/2002 | Colbert et al. |
| 2002/0109086 A1 | 8/2002 | Colbert et al. |
| 2002/0109087 A1 | 8/2002 | Colbert et al. |
| 2002/0117611 A1 | 8/2002 | Kley |
| 2002/0117951 A1 | 8/2002 | Merkulov et al. |
| 2002/0135755 A1 | 9/2002 | Kley |
| 2003/0007443 A1 | 1/2003 | Nickel |
| 2003/0010910 A1 | 1/2003 | Colbert et al. |
| 2003/0042922 A1 | 3/2003 | Houge et al. |
| 2003/0052585 A1 | 3/2003 | Guillorn et al. |
| 2003/0066960 A1 | 4/2003 | Colbert et al. |
| 2003/0075682 A1 | 4/2003 | Colbert et al. |
| 2003/0106998 A1 | 6/2003 | Colbert et al. |
| 2003/0122073 A1 | 7/2003 | Nakayama et al. |
| 2004/0106220 A1 | 6/2004 | Merkulov et al. |
| 2004/0168527 A1 | 9/2004 | Nakayama et al. |
| 2004/0265209 A1 | 12/2004 | Colbert et al. |

FOREIGN PATENT DOCUMENTS

| | | |
|---|---|---|
| EP | 1 274 092 A2 | 1/2003 |
| WO | WO 98/05920 | 2/1998 |
| WO | WO 00/19494 | 4/2000 |
| WO | WO 03/060923 A1 | 7/2003 |

* cited by examiner

DATA RECORDING DEVICE WITH CONDUCTING MICROTIPS AND PRODUCTION METHOD THEREOF

This application is a 371 of PCT/FR04/02755, filed Oct. 26, 2004.

BACKGROUND OF THE INVENTION

The invention relates to a data recording device comprising at least one electrically conducting microtip having an end designed to be brought into electric contact with a recording medium, the microtip comprising a longitudinal conducting core having a substantially constant cross-section.

1. State of the Art

Memory dot writing and reading techniques by microtips enable very large data storage densities to be obtained.

Several techniques are based on the use of electrically conducting microtips to perform for example local electrical resistivity mappings of a recording medium. To write or read data, the microtip is brought into contact with the recording medium or close to the latter. Progressive abrasion of the end of the microtips can cause degradation of the performances of the recording device and may result in destruction of the microtip.

Numerous types of recording media are proposed for storing data written and/or read from injection of current by means of the microtip. The electric contact surface between the microtip and the recording medium is one of the main parameters controlling the reading resolution and writing density obtained. A small radius of curvature for the apex of the microtip is generally sought for. Progressive abrasion can cause the electric contact surface between the microtip and the recording medium to be widened and thus impair the radius of curvature of the apex of the microtip and modify the electrical properties of the microtip losing the desired resolution.

Most conducting microtips are based on the silicon technology which enables a microtip apex with a very small radius of curvature to be obtained. One technique, for example, consists in first producing a layer of very highly doped and therefore conducting silicon. The layer is then etched anisotropically to sharpen the microtip. Another technique consists in first producing a non-doped silicon microtip and in covering the microtip with a layer of conducting materials such as nitrides or carbides which are moreover particularly hard materials. Certain techniques use the hardness of diamond to protect the microtip. The microtip is thus covered by a diamond layer, which requires complex fabrication processes presenting high costs.

These devices comprise microtips of pyramidal, conical or truncated-conical shape. These microtips are relatively solid but their electrical properties vary according to the wear process.

Certain devices comprise microtips of constant cross-section, which enables electrical properties to be obtained that are independent from the wear process. Such microtips are however very fragile.

Moreover, in the case of microtip lattices, to take account of the statistical dispersion of the lengths of the microtips, each microtip is supported by a flexible element, for example a cantilever, which enables all the microtips to be brought simultaneously into contact with the recording medium. Fabrication of the cantilevers does however add complex steps to the production process of the devices.

The document WO03/060923 describes a data recording device comprising a cantilever microtip lattice. Each microtip comprises a nanotube salient from the material of the microtip in which it is inserted. The cantilever material can comprise a polymer or a dielectric material, metals or polysilicon. The tip and cantilever can be delineated by lithography, dry etching or wet etching. The nanotube has a constant cross-section and the cross-section of the microtip material decreases in the direction of the end of the microtip.

2. Object of the Invention

It is one object of the invention to remedy these shortcomings and in particular to provide a device comprising at least one solid microtip, while presenting electrical properties independent from the wear process.

According to the invention, this object is achieved by the appended claims and in particular by the fact that the microtip is surrounded by a sheath made of non-conducting material, so that the free ends of the core and of the sheath are at the same level at the end of the microtip.

It is also an object of the invention to provide a method for production of a data recording device according to the invention, comprising an abrasion step, so that the free ends of the core and of the sheath are at the same level at the end of the microtip.

BRIEF DESCRIPTION OF THE DRAWINGS

Other advantages and features will become more clearly apparent from the following description of particular embodiments of the invention given as non-restrictive examples and represented in the accompanying drawings, in which.

DESCRIPTION OF PARTICULAR EMBODIMENTS

Figure 1:
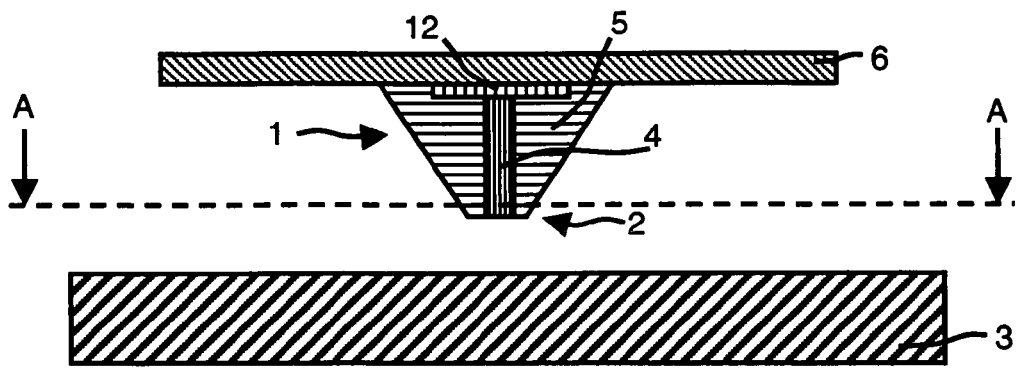
FIGS. 1 and 2 represent cross-sections of a particular embodiment of a data recording device according to the invention, respectively comprising a non-worn microtip and a worn microtip.

In FIG. 1, a data recording device comprises a truncated-cone-shaped microtip 1 having one end 2 designed to be brought into electric contact with a recording medium 3. The microtip 1 comprises a longitudinal conducting core 4 having a substantially constant cross-section and surrounded by a sheath 5 made of non-conducting material. The sheath 5 has for example a cross-section that decreases in the direction of the end 2 of the microtip 1. For example, the sheath 5 can have a truncated-cone-shaped or pyramidal part. In the particular embodiment represented in FIG. 1, the sheath 5 has a plateau, parallel to the recording medium 3, at the end 2 of the microtip 1, and the core 4 has a circular cross-section and is securely affixed to a substrate 6 by means of a conducting track 12. FIG. 1 represents the non-worn device.

When several microtips 1 are arranged by means of conducting tracks 12 on the same substrate 6, the substrate can be chosen insulating which enables the microtips 1 to be electrically isolated from one another. In the case of a single microtip 1, the substrate 6 can be chosen conducting and a conducting track 12 is not necessary.

Figure 2:
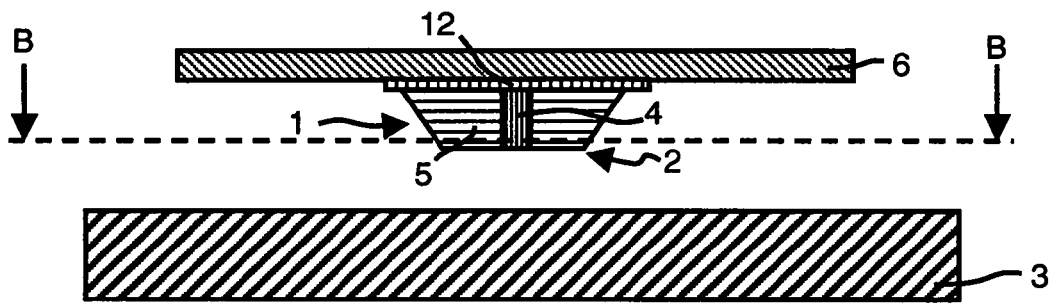

In FIG. 2, the data recording device of FIG. 1 is represented after wear. Thus, a part of the microtip 1 has been removed by progressive abrasion of the end 2.

Figure 3:
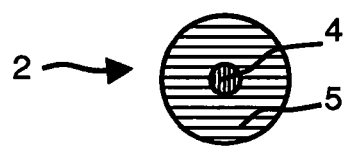
FIGS. 3 and 4 respectively represent the end of the microtip of the device of FIGS. 1 and 2 in cross-section along the line A-A and along the line B-B.
Figure 4:
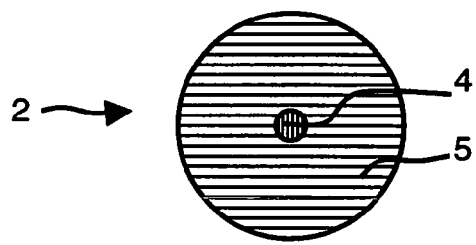

FIGS. 3 and 4 respectively illustrate the ends 2 of the truncated-cone-shaped microtip 1 according to FIGS. 1 and 2, without representing the recording medium. The sheath 5 of the end 2 represented in FIG. 4 is worn and therefore presents a larger external diameter than that of the sheath 5 of the non-worn end 2 represented in FIG. 3. The diameter of the core 4 is equal in FIGS. 3 and 4.

The cross-section of the conducting core 4 being substantially constant, the electric contact surface between the end 2 of the microtip 1 and the recording medium 3 is independent from the abrasion process step. The mechanical contact zone between the end 2 of the microtip 1 and the recording medium 3 is defined by the lateral dimensions of the sheath 5. The mechanical contact zone is thus larger than the electric contact surface. The contact force is thus distributed over an increasingly larger zone during the abrasion process and, consequently, the contact pressure is increasingly lower and the speed of the abrasion process decreases as wear progresses, resulting in the surfaces in presence taking exactly the same shape as one another, in particular in the case where there are several microtips.

The sheath 5 can be formed by an insulating material, for example silica, or by a material having a low conductivity for example by a semi-conducting material, so that the resistance of the sheath 5 is substantially greater than the resistance of the core 4. For example, the conductivity of the material of the sheath 5 can be ten times lower than the conductivity of the material of the core 4.

In a particular embodiment, the core 4 is formed by a carbon nanotube. For example, a carbon nanotube can be grown using a metallic track deposited on a silicon substrate, the metallic track typically comprising a catalyzer, for example a transition metal. For example, a method for growing vertically aligned carbon nanotubes using plasma enhanced chemical vapor deposition is described in the document "Growth process conditions of vertically aligned carbon nanotubes using plasma enhanced chemical vapor deposition" by M. Chhowalla et al. (J. Appl. Phys., Vol. 90, No. 10, 15 Nov. 2001). In this method, the metallic track is fragmented by sintering so as to form nanometric metallic particles on the substrate. During the chemical vapor deposition, a carbon nanotube grows under each nanometric metallic particle.

Figure 5:
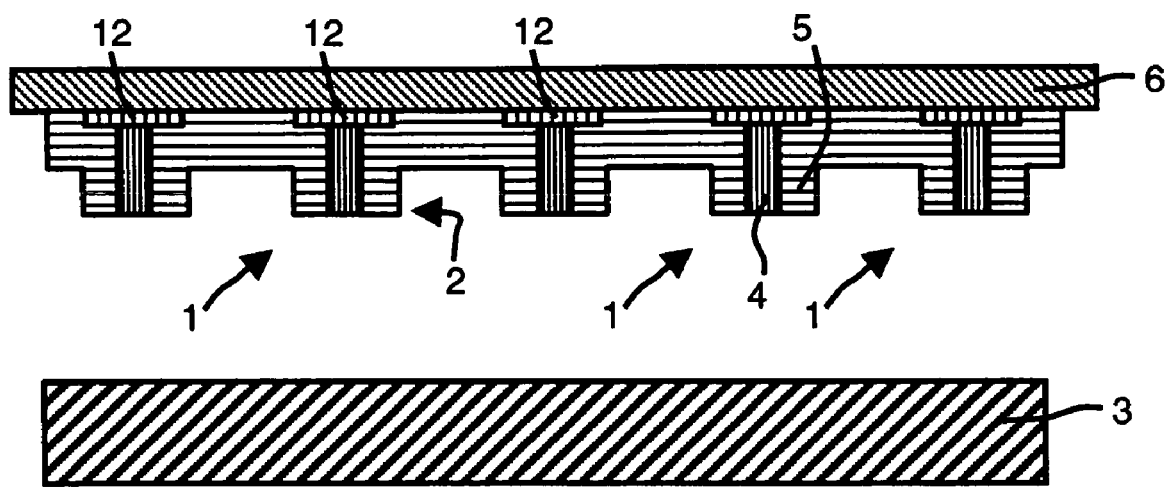
FIG. 5 represents a particular embodiment of a data recording device according to the invention comprising a microtip lattice.

The recording device represented in FIG. 5 comprises a multitude of microtips 1 arranged as a one-dimensional or a two-dimensional lattice. Their ends 2 generate a substantially flat common surface. Depending on the type of method used for production of the device, the ends 2 can generate a flat or a slightly concave surface, for example a spherical or cylindrical surface. The microtips 1 are respectively arranged on the conducting tracks 12 and are electrically separated by the substrate 6 the material whereof has a substantially lower conductivity, for example 10 times lower, than the material of the conducting tracks 12.

Figure 6:
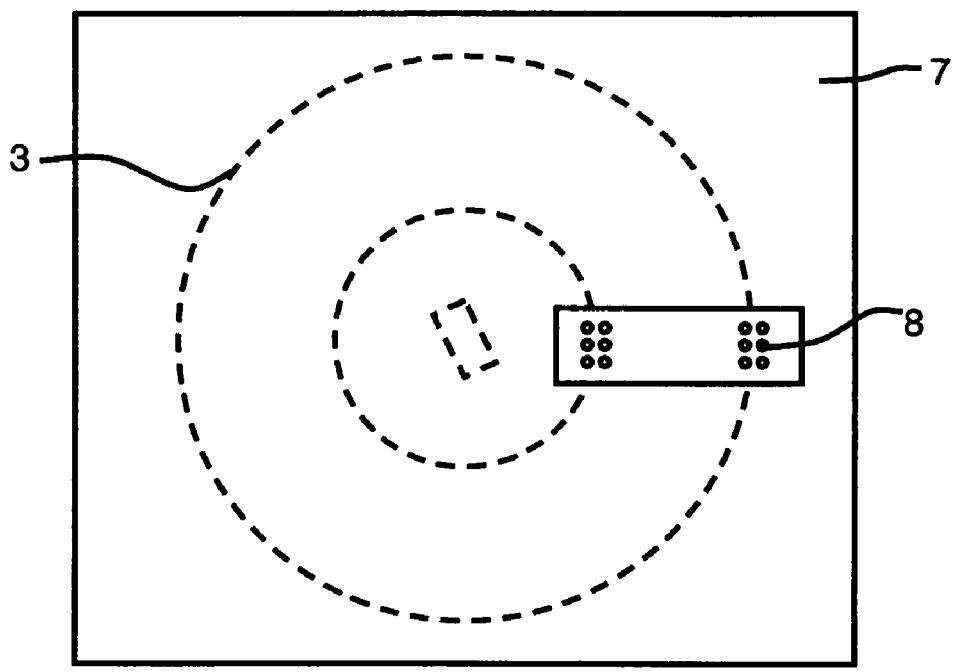
FIG. 6 illustrates a particular embodiment of a device according to the invention integrated in a chip also containing the recording medium.

FIG. 6 illustrates a recording device integrated in a dustproof chip 7 and also comprising a memory disc constituting the recording medium 3. The chip 7 is designed to communicate with a memory reader by means of a plurality of electric contacts 8 arranged outside the chip 7. An exchangeable memory is thus obtained comprising a read head formed by the microtips 1. The reader also comprises actuators to ensure relative movement of the read head and of the recording medium 3. For example, a motor can drive the memory disc and a radial translation unit can move the read head along the memory dot lines chosen on the disc. The amplitude of movement of the translation unit is for example greater than or equal to the linear pitch between two adjacent microtips 1, for example comprised between 10 µm and 100 µm.

The space between the microtips 1 and the recording medium 3 can be filled by a lubricant having a low conductivity, for example by graphite, silicone or a liquid, which ensures the electrical conduction between the microtip 1 and the recording medium 3. The electrical conductivity of the lubricant must be sufficiently low not to create a short-circuit between adjacent microtips 1 (Z-DOL or graphite or silicone type lubricant).

A method for producing a data recording device according to the invention comprises, after assembly of the constituent materials respectively the core 4 and sheath 5 of a microtip 1, an abrasion step so that the free ends of the core 4 and of the sheath 5 are at the same level at the end 2 of the microtip 1. The abrasion step is preferably performed by mechano-chemical planarization. On account of the statistical dispersion of the lengths of the bodies before abrasion, all the materials constituting the bodies 4 and the sheaths 5 can for example be polished until the thickness of the assembly corresponds for example to half of the mean length of the bodies 4.

A method for production of a data recording device according to FIG. 5 comprises the steps represented in FIGS. 7 to 11.

Figure 7:
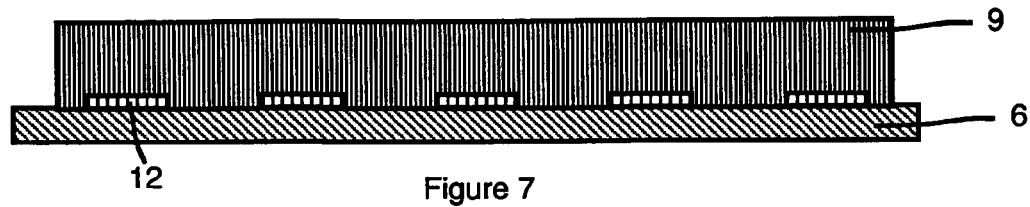
FIGS. 7 to 11 represent a particular embodiment of a method for production of the data recording device according to the invention.

The first step consists, as represented in FIG. 7, in depositing a layer 9 of conducting material on a substrate 6. The conducting material can be polycrystalline silicon, carbon or a metal and the substrate 6 is for example made from silicon covered with silica. Deposition of the layer 9 can be performed by a conventional process such as sputtering or chemical vapor deposition.

The substrate 6 has been previously provided with conducting tracks 12 by deposition of a metal layer, for example made of copper, etched by any photolithography and etching process. The bodies 4 are deposited on these conducting tracks 12 in the following steps.

Figure 8:
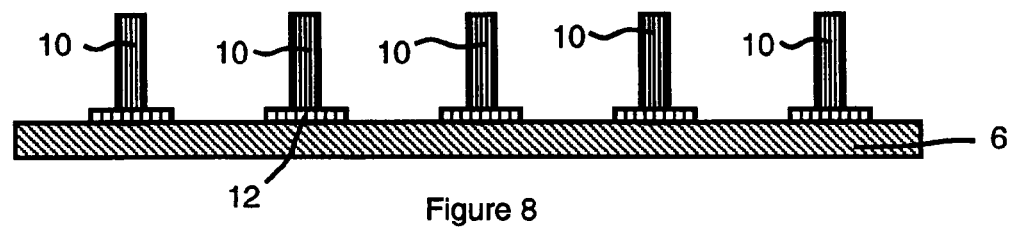

The second step consists, as represented in FIG. 8, in etching the conducting material of the layer 9 through a mask so as to form pillars 10 designed to each constitute a core 4 of a microtip 1.

Figure 9:
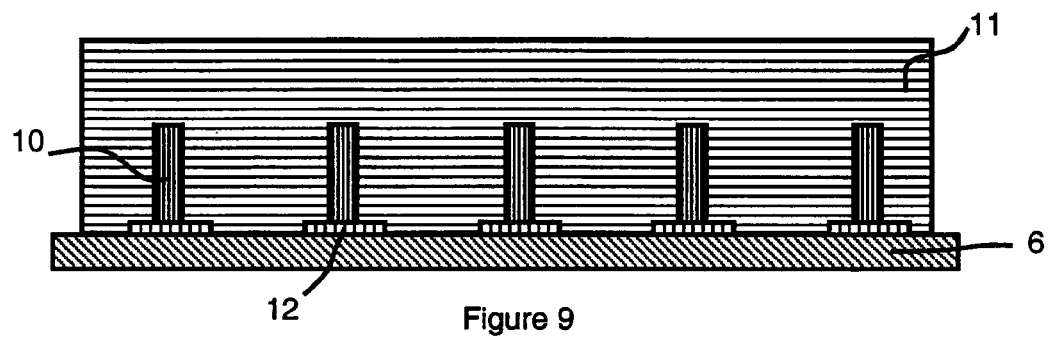

Then in a third step, illustrated in FIG. 9, a layer 11 of the non-conducting material designed to form the sheath 5 is deposited on the substrate 6 provided with the pillars 10. The different deposition methods depend on the non-conducting material chosen. Thus a layer of carbon of diamond like carbon (DLC) type can be deposited by chemical vapor deposition from methane or carbon monoxide, a layer of $Si_3N_4$ can be achieved by sputtering and a layer of $SiO_2$ can be obtained by spin coating of silica obtained by a sol-gel type process. The deposition thickness of the layer 11 of the non-conducting material represented in FIG. 9 is chosen such that the pillars 10 are completely immersed in the layer 11. However, it is also possible to deposit a layer 11 the thickness of which does not exceed the height of the pillars 10.

Figure 10:
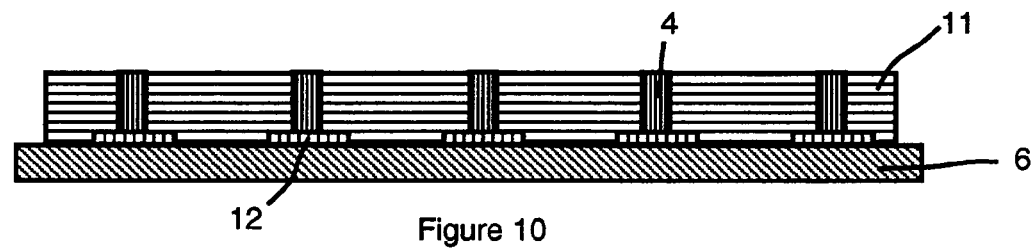

Then a fourth step consists, as represented in FIG. 10, in performing the abrasion, as described above, so that, at the end of abrasion, the free ends of the pillars 10 and of the sheaths 5 are at the same level at the end 2 of each microtip 1.

Figure 11:
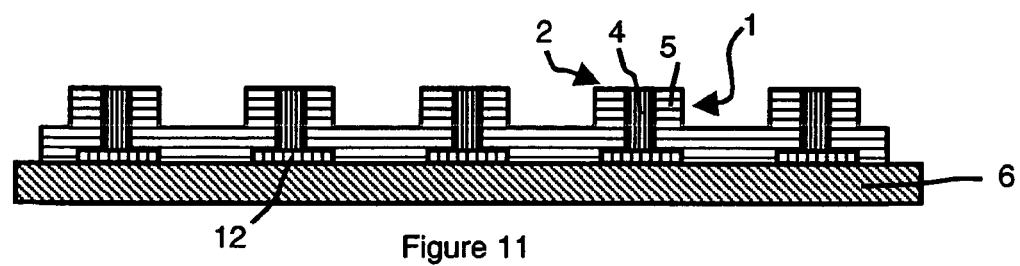

In a fifth step, represented in FIG. 11, the non-conducting material of the layer 11 is etched so as to delineate the sheath 5 laterally. The mechanical contact zone between the end 2 of the microtip 1 and the recording medium 3 can therefore be reduced and the friction forces are therefore reduced. The layer 11 is etched between the bodies 4, in a gap of predetermined width that is smaller than the distance between two bodies 4, over a predetermined depth which does not necessarily correspond to the thickness of the layer 11. In this way, the sheath 5 of each microtip represented in FIG. 11 obtains a constant cross-section at the end 2 of the microtip, whereas near to the substrate 6, the layer 11 covers the complete space between the pillars 10. Etching can be performed by chemical means or by ion bombardment. The etching step also comprises lithographic masking.

A single microtip or any two-dimensional or one-dimensional lattice of microtips can be achieved by a method similar to the method described above.

Whereas in the method represented in FIGS. 7 to 11, the bodies 4 are produced before the sheath 5, in another embodiment, the sheath 5 is produced before the bodies 4. In all cases lithography or a self-organization process can be implemented to delineate the bodies 4.

In the case where the core 4 is fabricated first, for example by etching of a conducting material (FIG. 8) or by local growth in the case of carbon nanotubes, the diameter of the core 4 thus obtained may have to be reduced, which can be done by an isotropic reactive etching step. Deposition of the sheath 5 (FIG. 9) can then be performed by physical vapor deposition, the case of an amorphous graphite for example, by chemical vapor deposition, the case of silica, nitrides or diamond like carbon, or by a sol-gel type method, for example by dip-coating.

Figure 12:
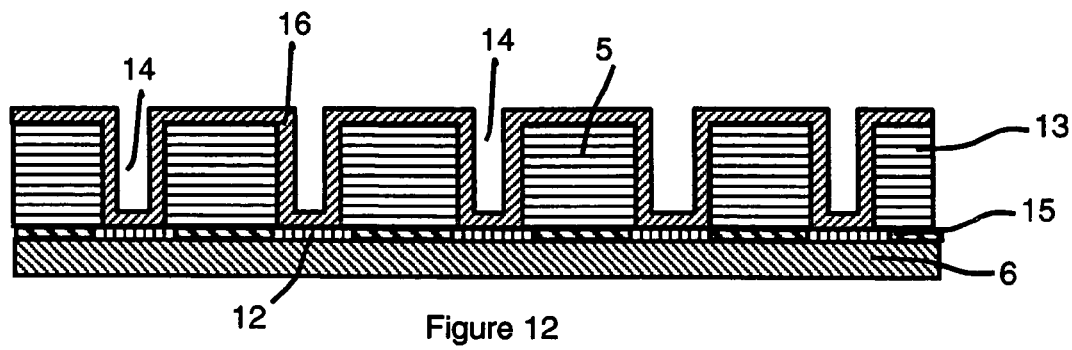
FIGS. 12 to 16 represent another particular embodiment of a method for production of the data recording device according to the invention.
Figure 13:
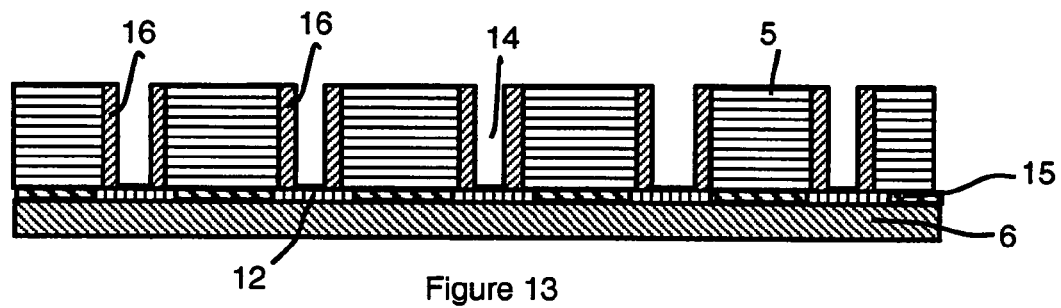

FIGS. 12 to 16 illustrate a fabrication method in which the sheath 5 is produced before the core 4. The microtips 1 are achieved on a substrate 6 comprising for example conducting layers 12 and a planarization layer 15. A layer 13 of a material designed to constitute the sheath 5 is deposited by any method, for example by one of the methods mentioned above. Then, as represented in FIG. 12, pass-through holes 14 are etched in the layer 13. To reduce the size of the holes 14 thus obtained, a material 16 is deposited on the front surface of the sheaths 5, on the walls of the holes 14 and on the bottom of each hole 14. Anisotropic etching then enables the material 16 to be removed from the bottom of each hole 14 and from the front surface of the sheaths 5 (FIG. 13).

Figure 14:
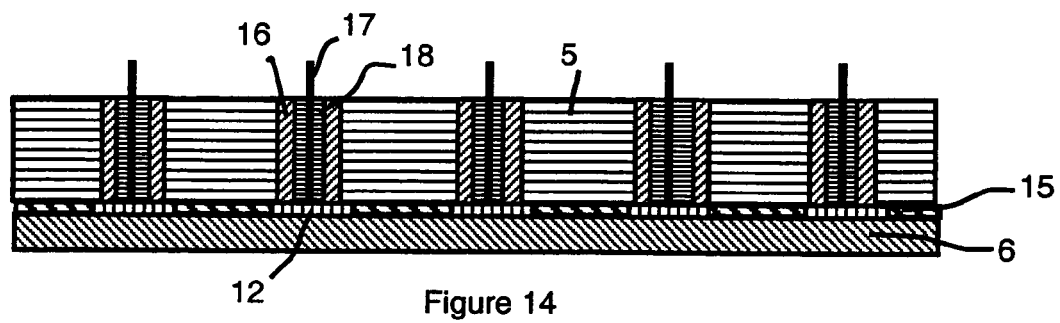
Figure 15:
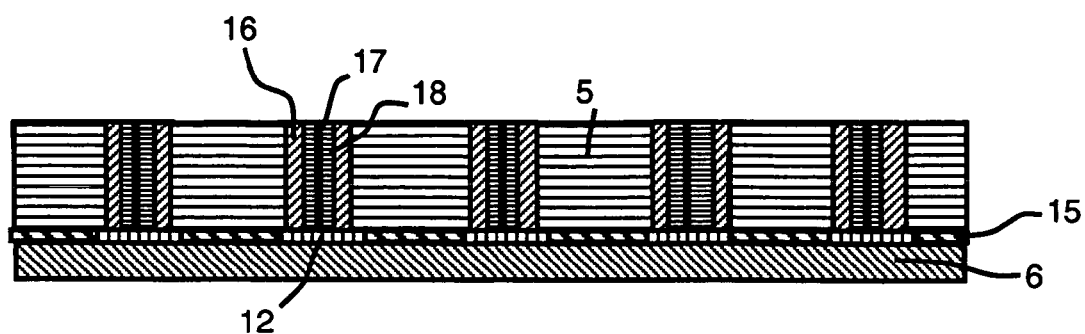
Figure 16:
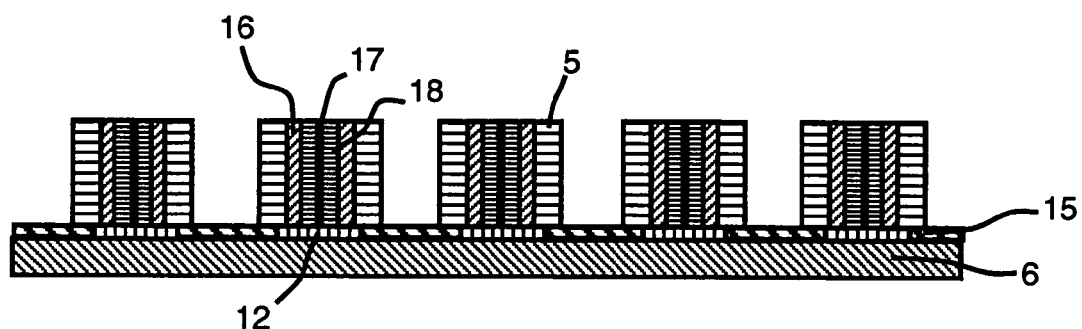

The core is then produced by any envisageable deposition method of a conducting material such as tungsten or by deposition of a catalyzer, such as nickel for growth of carbon nanotubes 17 from the bottom of each hole 14, as represented in FIG. 14. In the latter case, the hole is filled with an additional material 18, for example by electrolytic deposition of a conducting material, for example tungsten, copper or nickel. Then, as represented in FIG. 15, abrasion of the front surface of the stack enables uniform lengths of the bodies 4 formed by the carbon nanotubes 17 to be obtained. Then the sheath 5 is etched over a predetermined depth, for example over its whole depth as represented in FIG. 16 or over an intermediate depth as represented in FIG. 11.

The method according to the invention enables a microtip lattice 1 to be obtained the ends 2 whereof form a substantially flat common surface, which enables all the microtips 1 to be brought simultaneously into contact with the recording medium 3 without needing flexible elements such as cantilevers to compensate length differences of the microtips 2.

The microtip lattice can be used as a two-dimensional matrix by similitude with the millipede® solution of the IBM corporation, or as an array for use with a memory in the form of a rotary disc. In the case of a rotary disc, the recording medium 3 can for example be made of plastic.

The invention is not limited to the embodiments represented. In particular, the sheath 5 can have an outside wall of any shape. For example, the wall can have a cylindrical or square cross-section. The microtip 1 according to the invention can also be arranged on a cantilever, obtained for example by etching after the microtip has been produced.

The invention claimed is:

1. Data recording device comprising at least one electrically conducting microtip having an end designed to be brought into electric contact with a recording medium, the microtip comprising a longitudinal conducting core having a substantially constant cross-section, device wherein the microtip is surrounded by a sheath made of non-conducting material, so that the free ends of the core and of the sheath are at the same level at the end of the microtip.

2. Device according to claim 1, wherein the sheath is made of insulating material.

3. Device according to claim 1, wherein the sheath is made of material having a low conductivity.

4. Device according to claim 1, wherein the sheath has a cross-section that decreases in the direction of the end of the microtip.

5. Device according to claim 4, wherein the sheath comprises a truncated-cone-shaped part.

6. Device according to claim 1, wherein the core is formed by a carbon nanotube.

7. Device according to claim 1, comprising a multitude of microtips arranged as a lattice, the ends thereof generating a substantially flat common surface.

8. Device according to claim 7, wherein it is integrated in a dustproof chip also containing the recording medium and designed to communicate with a memory reader by means of a plurality of electric contacts arranged outside the chip.

9. Device according to claim 1, wherein the core is securely affixed to a substrate by means of a conducting track.

10. Device according to claim 9, wherein the substrate has a substantially lower conductivity than the conducting track.

11. Method for production of a data recording device according to claim 1, comprising an abrasion step so that the free ends of the core (and of the sheath are at the same level at the end of the microtip.

12. Method for production according to claim 11, wherein the abrasion step is performed by mechano-chemical planarization.

13. Method for production according to claim 11, comprising, before the abrasion step,
   deposition of a layer of conducting material on a substrate,
   etching of the conducting material, through a mask, so as to form at least one pillar designed to form the core of a microtip,
   deposition, at least on the substrate, of a layer of the non-conducting material designed to constitute the sheath,
   and, after the abrasion step, etching of the non-conducting material so as to delineate the sheath laterally.

14. Method for production according to claim 11, comprising, before the abrasion step,
   deposition of a layer of non-conducting material designed to constitute the sheath on a substrate,
   etching of pass-through holes in the layer,
   deposition of a material at least on the walls and the bottom of each hole,
   removal of the material from the bottom of each hole by anisotropic etching,
   deposition of the material designed to form the core in the holes,
   and, after the abrasion step, etching of the layer so as to delineate the sheath laterally.

* * * * *